(12) United States Patent
Sarangi et al.

(10) Patent No.: US 10,481,203 B2
(45) Date of Patent: Nov. 19, 2019

(54) GRANULAR DYNAMIC TEST SYSTEMS AND METHODS

(71) Applicant: NVIDIA Corporation, Santa Clara, CA (US)

(72) Inventors: Shantanu Sarangi, Saratoga, CA (US); Milind Sonawane, San Jose, CA (US); Adarsh Kalliat Balagopala, Santa Clara, CA (US); Amit Sanghani, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 15/478,176

(22) Filed: Apr. 3, 2017

(65) Prior Publication Data

US 2017/0205465 A1 Jul. 20, 2017

Related U.S. Application Data

(63) Continuation-in-part of application No. 15/336,736, filed on Oct. 27, 2016, which is a continuation-in-part of application No. 15/336,747, filed on Oct. 27, 2016, application No. 15/478,176, filed on Apr. 3, 2017, which is a continuation-in-part of application No. 15/336,716, filed on Oct. 27, 2016.

(60) Provisional application No. 62/318,193, filed on Apr. 4, 2015, provisional application No. 62/247,195, filed on Oct. 27, 2015, provisional application No. 62/285,429, filed on Oct. 27, 2015.

(51) Int. Cl.
*G01R 31/317* (2006.01)
*G01R 31/3185* (2006.01)
*G06F 11/00* (2006.01)

(52) U.S. Cl.
CPC ......... *G01R 31/31726* (2013.01); *G01R 31/318552* (2013.01)

(58) Field of Classification Search
CPC ....... G01R 31/31726; G01R 31/31727; G01R 31/318552; G01R 31/318555; G01R 31/318572; G06F 11/00
USPC ....... 714/700, 726, 727; 713/503, 400, 401; 327/293, 295, 296; 375/354, 357, 362
See application file for complete search history.

(56) References Cited

U.S. PATENT DOCUMENTS

| 5,535,331 A | 7/1996 | Swoboda et al. |
| 5,656,963 A * | 8/1997 | Masleid ............. G06F 1/10 257/208 |

(Continued)

*Primary Examiner* — John J Tabone, Jr.

(57) ABSTRACT

In one embodiment, a system comprises: a global clock input for receiving a global clock, a plurality of partitions; and a skew tolerant interface configured to compensate for clock skew differences between a global clock from outside at least one of the partitions and a balanced local clock within at least one of the partitions. The partitions can be test partitions. The skew tolerant interface can cross a mesochronous boundary. In one exemplary implementation, the skew tolerant interface includes a deskew ring buffer on communication path of the at least one partition. pointers associated with the ring buffer can be free-running and depend only on clocks being pulsed when out of reset. The scheme can be fully synchronous and deterministic. The scheme can be modeled for the ATPG tools using simple pipeline flops. The depth of the pipeline can be dependent on the pointer difference for the read/write interface. The global clock input can be part of a scan link.

20 Claims, 18 Drawing Sheets

(56) References Cited

U.S. PATENT DOCUMENTS

| | | | |
|---|---|---|---|
| 5,805,608 A | 9/1998 | Baeg et al. | |
| 5,812,562 A | 9/1998 | Baeg | |
| 5,970,241 A | 10/1999 | Deao et al. | |
| 6,016,555 A | 1/2000 | Deao et al. | |
| 6,055,649 A | 4/2000 | Deao et al. | |
| 6,065,106 A | 5/2000 | Deao et al. | |
| 6,081,885 A | 6/2000 | Deao et al. | |
| 6,106,568 A | 8/2000 | Beausang et al. | |
| 6,112,298 A | 8/2000 | Deao et al. | |
| 6,163,583 A | 12/2000 | Lin et al. | |
| 6,192,092 B1* | 2/2001 | Dizon | G06F 1/10 375/371 |
| 6,343,365 B1 | 1/2002 | Matsuzawa et al. | |
| 6,473,439 B1* | 10/2002 | Zerbe | G06F 1/12 370/503 |
| 6,493,802 B1 | 12/2002 | Razdan et al. | |
| 6,586,921 B1 | 7/2003 | Sunter | |
| 6,622,255 B1* | 9/2003 | Kurd | G06F 1/10 713/401 |
| 6,724,328 B1* | 4/2004 | Lui | H03M 9/00 341/101 |
| 6,763,485 B2 | 7/2004 | Whetsel | |
| 6,785,856 B1 | 8/2004 | Parker et al. | |
| 6,813,739 B1 | 11/2004 | Grannis, III | |
| 6,949,958 B2* | 9/2005 | Zerbe | G06F 1/12 327/3 |
| 7,015,741 B2* | 3/2006 | Tschanz | G06F 1/10 327/293 |
| 7,046,174 B1* | 5/2006 | Lui | H03K 5/135 341/100 |
| 7,093,150 B1* | 8/2006 | Norman | G06F 1/10 713/400 |
| 7,245,684 B2* | 7/2007 | Adkisson | G06F 1/10 375/219 |
| 7,288,973 B2* | 10/2007 | Zerbe | G06F 1/12 327/144 |
| 7,409,612 B2 | 8/2008 | Van De Logt et al. | |
| 7,447,961 B2* | 11/2008 | Tan | G01B 31/318541 714/726 |
| 7,509,549 B2 | 3/2009 | Larson et al. | |
| 7,613,967 B1* | 11/2009 | Tan | G01B 31/318594 714/726 |
| 7,831,856 B1* | 11/2010 | Liu | G01R 31/318516 714/2 |
| 7,984,369 B2 | 7/2011 | Sul et al. | |
| 7,987,401 B2 | 7/2011 | Pandey | |
| 8,112,654 B2* | 2/2012 | Bjerregaard | G06F 1/105 375/355 |
| 8,205,182 B1* | 6/2012 | Zlatanovici | G06F 17/505 703/16 |
| 8,438,437 B2 | 5/2013 | Jain et al. | |
| 8,694,844 B2 | 4/2014 | Whetsel | |
| 8,887,117 B1* | 11/2014 | Chuang | G06F 17/5077 716/124 |
| 9,103,879 B2 | 8/2015 | Douskey et al. | |
| 9,116,205 B2 | 8/2015 | Douskey et al. | |
| 9,437,328 B2 | 9/2016 | Yang | |
| 9,459,651 B2* | 10/2016 | Moheban | H04L 7/0008 |
| 9,529,044 B1 | 12/2016 | Taneja et al. | |
| 9,733,308 B2 | 8/2017 | Whetsel | |
| 10,281,524 B2 | 5/2019 | Chadalavda et al. | |
| 10,317,463 B2 | 6/2019 | Sonawane et al. | |
| 2002/0162063 A1 | 10/2002 | Whetsel | |
| 2002/0196886 A1* | 12/2002 | Adkisson | G06F 1/12 375/362 |
| 2002/0199124 A1* | 12/2002 | Adkisson | G06F 1/12 713/400 |
| 2003/0053489 A1* | 3/2003 | Zerbe | G06F 1/12 370/503 |
| 2003/0229834 A1 | 12/2003 | Cooke | |
| 2004/0190665 A1* | 9/2004 | Uratani | H04L 7/0337 375/354 |
| 2004/0194109 A1 | 9/2004 | Boros et al. | |
| 2005/0024074 A1 | 2/2005 | Benjamin et al. | |
| 2005/0055617 A1 | 3/2005 | Wang et al. | |
| 2005/0102643 A1* | 5/2005 | Hou | G06F 1/10 716/104 |
| 2005/0209805 A1 | 9/2005 | Chang et al. | |
| 2005/0234674 A1 | 10/2005 | Bundy et al. | |
| 2005/0242836 A1 | 11/2005 | Goetting et al. | |
| 2005/0262492 A1 | 11/2005 | Goetting et al. | |
| 2006/0022724 A1* | 2/2006 | Zerbe | G06F 1/12 327/141 |
| 2006/0026473 A1* | 2/2006 | Patrick Tan | G01R 31/31854 714/726 |
| 2006/0095818 A1 | 5/2006 | Bratt et al. | |
| 2006/0149987 A1* | 7/2006 | Klowden | G06F 1/12 713/401 |
| 2007/0106923 A1 | 5/2007 | Aitken et al. | |
| 2007/0300001 A1 | 12/2007 | Dirscherl et al. | |
| 2008/0008015 A1 | 1/2008 | Darbinyan et al. | |
| 2008/0034334 A1 | 2/2008 | Laouamri et al. | |
| 2008/0046770 A1* | 2/2008 | Jong | G06F 1/12 713/375 |
| 2008/0276116 A1* | 11/2008 | Bjerregaard | G06F 1/10 713/501 |
| 2009/0150709 A1* | 6/2009 | Arnold | H04L 7/02 713/600 |
| 2009/0184735 A1* | 7/2009 | Wicki | G06F 1/08 327/9 |
| 2010/0223519 A1 | 9/2010 | Swoboda | |
| 2010/0235698 A1 | 9/2010 | Diewald et al. | |
| 2011/0099442 A1 | 4/2011 | Hales et al. | |
| 2011/0221469 A1 | 9/2011 | Schlagenhaft | |
| 2012/0117436 A1 | 5/2012 | Portolan et al. | |
| 2012/0146535 A1 | 6/2012 | Lee et al. | |
| 2012/0159276 A1 | 6/2012 | Zandian et al. | |
| 2013/0159800 A1 | 6/2013 | Ravi et al. | |
| 2013/0194016 A1 | 8/2013 | Wimer | |
| 2014/0089750 A1 | 3/2014 | Douskey et al. | |
| 2014/0157067 A1 | 6/2014 | Yang | |
| 2014/0247080 A1* | 9/2014 | Moheban | G06F 1/10 327/295 |
| 2014/0292385 A1 | 10/2014 | Bahl et al. | |
| 2014/0298125 A1 | 10/2014 | Devadze et al. | |
| 2015/0046763 A1 | 2/2015 | Makar et al. | |
| 2015/0178102 A1 | 6/2015 | Regner et al. | |
| 2015/0220470 A1* | 8/2015 | Chen | H04L 49/109 710/105 |
| 2015/0229469 A1 | 8/2015 | Hainz | |
| 2016/0070619 A1 | 3/2016 | Moran et al. | |
| 2017/0115338 A1 | 4/2017 | Chadalavda et al. | |
| 2017/0115345 A1 | 4/2017 | Sonawane et al. | |
| 2017/0115346 A1 | 4/2017 | Sonawane et al. | |
| 2017/0115351 A1 | 4/2017 | Datla Jagannadha et al. | |
| 2017/0115352 A1 | 4/2017 | Jayaraman et al. | |
| 2017/0115353 A1 | 4/2017 | Sonawane et al. | |
| 2017/0133070 A1* | 5/2017 | Ware | G11C 8/18 |
| 2017/0195754 A1 | 7/2017 | Grambichler | |
| 2017/0269145 A1 | 9/2017 | Whetsel | |
| 2018/0122444 A1* | 5/2018 | Ware | G06F 13/4234 |

* cited by examiner

700

710
Distributing a first clock to a plurality of partitions.

720
Generating a second clock that is locally balanced with at least one of the partitions.

730
Performing mesochronous synchronization to mitigate clock skew constraint between the first clock and the second clock.

FIG 7

GRANULAR DYNAMIC TEST SYSTEMS AND METHODS

RELATED APPLICATIONS

This application claims priority to and the benefit of U.S. Provisional Application Ser. No. 62/318,193, filed on Apr. 4, 2016, entitled "SCANS SYSTEMS AND METHODS" which is hereby incorporated by reference in their entirety for all intents and purposes. This application is also a continuation in part which claims priority to and the benefit of:

U.S. Utility application Ser. No. 15/336,716 filed on Oct. 27, 2016, entitled Granular Dynamic Test Systems and Methods;

U.S. Utility application Ser. No. 15/336,736 filed on Oct. 27, 2016, entitled Method and System for Dynamic Standard Test (DSTA) for Logic Block Reuse; and U.S. Utility application Ser. No. 15/336,747 filed on Oct. 27, 2016, entitled Scan System Interface (SSI) module;

all of which in turn claim priority to and the benefit of:

U.S. Provisional Application Ser. No. 62/247,195 entitled "GRANULAR DYNAMIC TEST SYSTEMS AND METHODS" entitled "SCANS SYSTEMS AND METHODS" filed on Oct. 27, 2015, and U.S. Provisional Application Ser. No. 62/285,429 entitled "SCANS SYSTEMS AND METHODS" filed on Oct. 27, 2015;

which are all hereby incorporated by reference in their entirety for all intents and purposes.

BACKGROUND

Field of the Invention

The present invention relates to the field of circuit testing. In one embodiment, granular dynamic test systems and methods are utilized to facilitate fast and flexible test partition communication and operation.

Background

Numerous electronic technologies such as digital computers, video equipment, and telephone systems have facilitated increased productivity and reduced costs in processing information in most areas of business, science, and entertainment. Testing the components is typically an important activity in ensuring proper performance and accurate results. The testing of semiconductor devices often involves performing test operations in accordance with controls referred to as test patterns. Execution of the test patterns typically involves loading and unloading scan chains with test vectors. However, there are a number of factors that can impact testing and traditional testing approaches are often costly and inefficient.

A system on chip (SOC) design is typically composed of several blocks of circuitry, some of which may have similar designs that are used or replicated in different parts of the chips. The several blocks of circuitry are often configured or organized in test blocks or test partitions for purposes of testing the circuitry. Traditional approaches to generating a full set of conventional test patterns targeted at multiple test partitions and executing the test patterns at substantially similar or parallel times is computationally intensive and time consuming. These conventional attempts are often unable to meet limited cost budgets and constrained project schedules.

Transistor feature sizes continue to shrink and smaller transistors allow more circuits to be included in a given die area. Although transistor technological advances offer a number of advantages, they also create design-for-testability (DFT) challenges. In traditional scan based tests, a significant portion of test time is spent communicating information to and from internal components (e.g., loading test commands, loading test patterns or test vectors, unloading test results, etc.). Larger and more complex circuits usually require longer test times. Conventional attempts at reducing test times by increasing shift clock frequencies or testing the entire design at the same time are often problematic and ineffective. In particular, traditional synchronous clocking schemes usually add or complicate insertion delays on the clock network which typically leads to higher jitter and non-deterministic. Conventional approaches also often have significant problems with globally balancing clocks in the interconnecting clock distribution backbone portions coupled to multiple test blocks.

SUMMARY

In one embodiment, a system comprises: a global clock input for receiving a global clock, a plurality of partitions; and a skew tolerant interface configured to compensate for clock skew differences between a global clock from outside at least one of the partitions and a balanced local clock within at least one of the partitions. The partitions can be test partitions. The skew tolerant interface can cross a mesochronous boundary. In one exemplary implementation, the skew tolerant interface includes a deskew ring buffer on communication path of the at least one partition. Pointers associated with the ring buffer can be free-running and depend only on clocks being pulsed when out of reset. The scheme can be fully synchronous and deterministic. The scheme can be modeled for the ATPG tools using simple pipeline flops. The depth of the pipeline can be dependent on the pointer difference for the read/write interface. The global clock input can be part of a scan link.

In one embodiment, a method comprises: distributing a first clock to a plurality of partitions; generating a second clock that is locally balanced with at least one of the partitions; and performing mesochronous synchronization to mitigate clock skew constraint between the first clock and the second clock. The first clock is an incoming distributed clock and the second clock is a balanced local clock. In one embodiment, the ring buffer is utilized in the performance of the mesochronous synchronization. The respective input and output pointers associated with the ring buffer can be asynchronously reset. The respective input and output pointers associated with a ring buffer can be asynchronously de-asserted with clocks off. A reset as well as the rest default values can be JTAG programmable. After a reset there can be a fixed difference in a spread between the write and read pointer. In one exemplary implementation, the difference is based on the skew of the first clock and the second clock. The difference can be used for timing the data path crossings using the multi cycle scheme. The partitions can be test partitions.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 7 is a flow chart of a method in accordance with one embodiment.

DETAILED DESCRIPTION OF THE INVENTION

Figure 1:
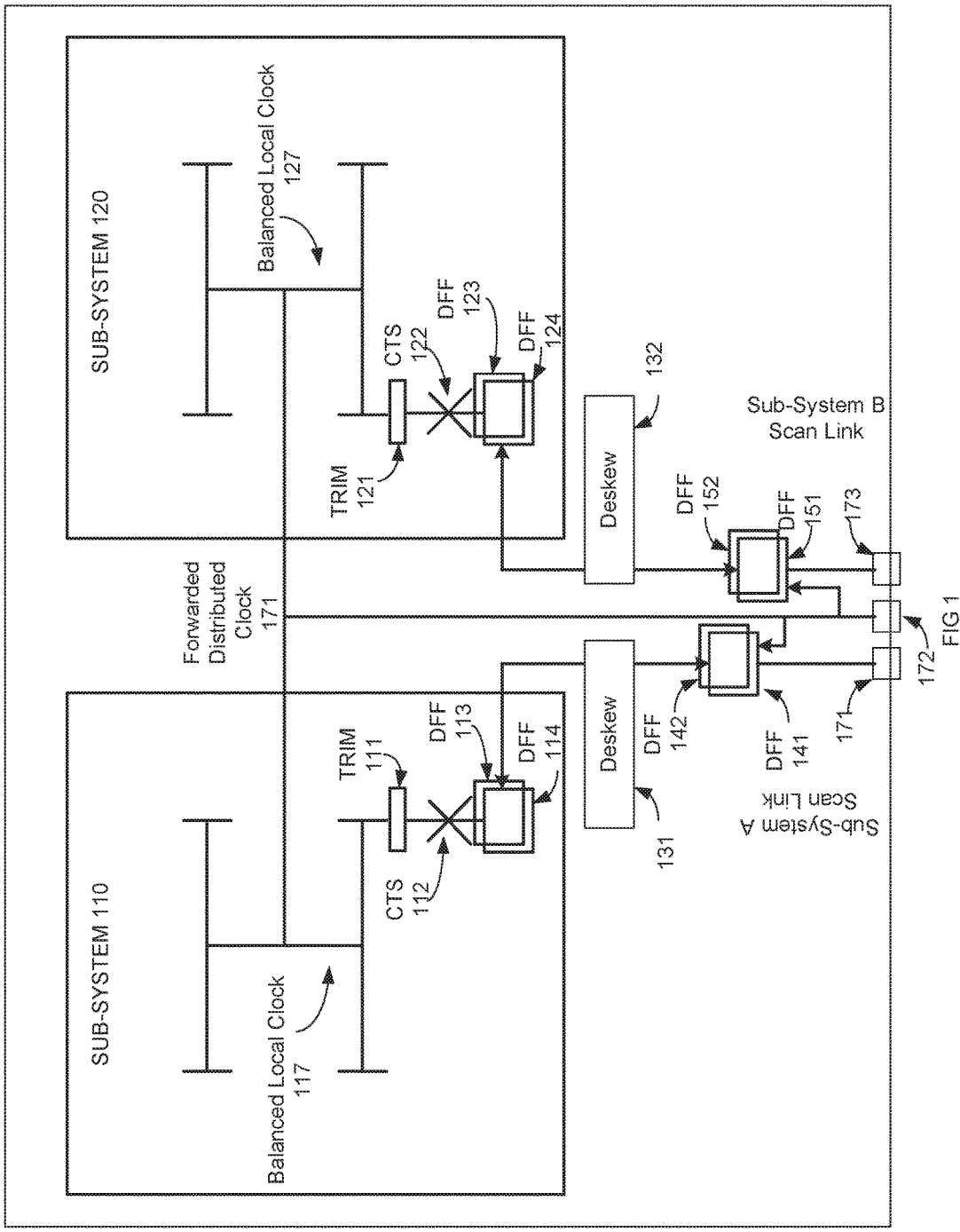
FIG. 1 is a block diagram of exemplary system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Integrated circuit partition boundary crossing coordination systems and methods that facilitate data communications across a partition boundary are presented. In one embodiment, the systems and methods facilitate coordination of data communications across a partition boundary where the data is clocked by a first clock on one side of the boundary and a second clock on the other side of the boundary. The first clock and second clock can have different characteristics (e.g., phases, frequencies, amplitudes, etc.). The first and second clock can have a mesochronous relationship.

In one embodiment, circuits under test in a System On a Chip (SOC) design are configured or organized into a hierarchy of groups or sets of circuitry that can be organized in partitions or sub-systems. The partitions and components therein can be organized based on a variety of factors (e.g., components involved in a type of function, particular design of the circuitry, intellectual property, size, portion of die area, number of functional components, electrical characteristics, safety limitations, power consumption, etc.). It is appreciated that the partitions can have a variety of configurations. The partitions or sub-systems can be defined by boundaries and signals can be communicated across the boundaries. A partition or subsystem interface can coordinate timing of signal communication across boundaries associated with partitions or sub-system boundaries of an integrated circuit.

It is appreciated, boundary crossing coordination is compatible with various clock schemes or clock approaches. In one embodiment, the first clock is utilized to control timing of operations in a partition or sub-system and the second clock is utilized to control timing of operation outside a partition or sub-system. In one exemplary implementation, the first clock is a local clock within the partition and the second clock is a distributed clock that is distributed outside the partition. The local clock within the partition can be balanced. The distributed clock can have a number of characteristics (e.g., communicated to a plurality of partitions or sub-sections, globally distributed, be unbalanced, be received from an external chip pin or interface etc.). The first clock can be based upon or derived from the second clock.

Data communication across partition boundaries can be coordinated based upon various considerations. Some environments or applications involve particular timing constraints and the partition or sub-system boundary coordination interfaces facilitate compliance of data communication with the constraints. The timing constraints can correspond to environment or application requirements. In one embodiment, the coordination component participates in a test application or environment and facilitates coordination of the data communication with in accordance with various aspects of the testing. In one exemplary implementation, the testing has particular timing requirement with respect to when data reaches a particular destination or component.

In one embodiment, the partition boundary crossing coordination uses a deskew interface to facilitate data communication across partition or sub-system boundaries. The coordination can form a multi-cycle skew tolerant interface. In one exemplary implementation, a coordination interface includes ring buffers for inbound and outbound data paths that cross partition or subsystem boundaries. Read and write pointers associated with the ring buffers can be asynchronously reset (and deasserted) with clocks off. The reset as well as the reset default values can be programmable. In one exemplary implementation, after reset there is a fixed difference or spread between the write and read pointer. The difference can be based on the skew of clock external to the partition and clock internal in the partition. This difference can be used for timing the data path crossings using the multi cycle scheme. In one embodiment, the pointers are free-running and depend only on clocks being pulsed when out of reset. In one exemplary implementation, the scheme is fully synchronous and deterministic. Partition boundary crossing system and methods can methods can be used in a variety of applications (e.g., CPUs, GPUs, mobile device SOCs, etc.).

FIG. 1 is a block diagram of exemplary system 100 in accordance with one embodiment. System includes subsystem or partition 110 and subsystem or partition 120, coordination components 131 and 132, flip flops 141, 142, 151, and 152, scan test communication ports 171, 172 and 173. Subsystem 110 includes balanced local clock path 117, trim component 111, CTS 112, and flip flops 113 and 114. Subsystem 120 includes balanced local clock path 127, trim component 121, CTS 122, and flip flops 123 and 124. In one embodiment, coordination components 131 and 132 adjust data input communication. The adjustment can be directed to facilitating compliance with application requirements for data crossing respective partition 110 and 120 boundaries. The adjustment can be based upon skew corresponding to differences between forwarded distributed clock 171 and balanced local clock (e.g., 117 and 127 respectively)

The clocks 117 and 127 of partitions 110 and 120 respectively are locally balanced in accordance with one embodiment. Distributed or global clocks can be forwarded without worrying about the balancing of the clock skew between a distributed clock and a local clock. In one embodiment, the coordination components 131 and 132 are configured as skew tolerant scan text interfaces. A mesochronous synchronization can be used to mitigate data communication issues associated with clock skew constraints between distributed clock 171 and locally balanced clocks 117 and 127. The coordination components 131 and 132 can facilitate cross over or communication from zero insertion delay point to a deep insertion tree and vice versa. In traditional approaches, a global fast clock forwarded from a chip pin can create mesochronous interfacing issues at the boundary of the sub-systems.

Figure 2:
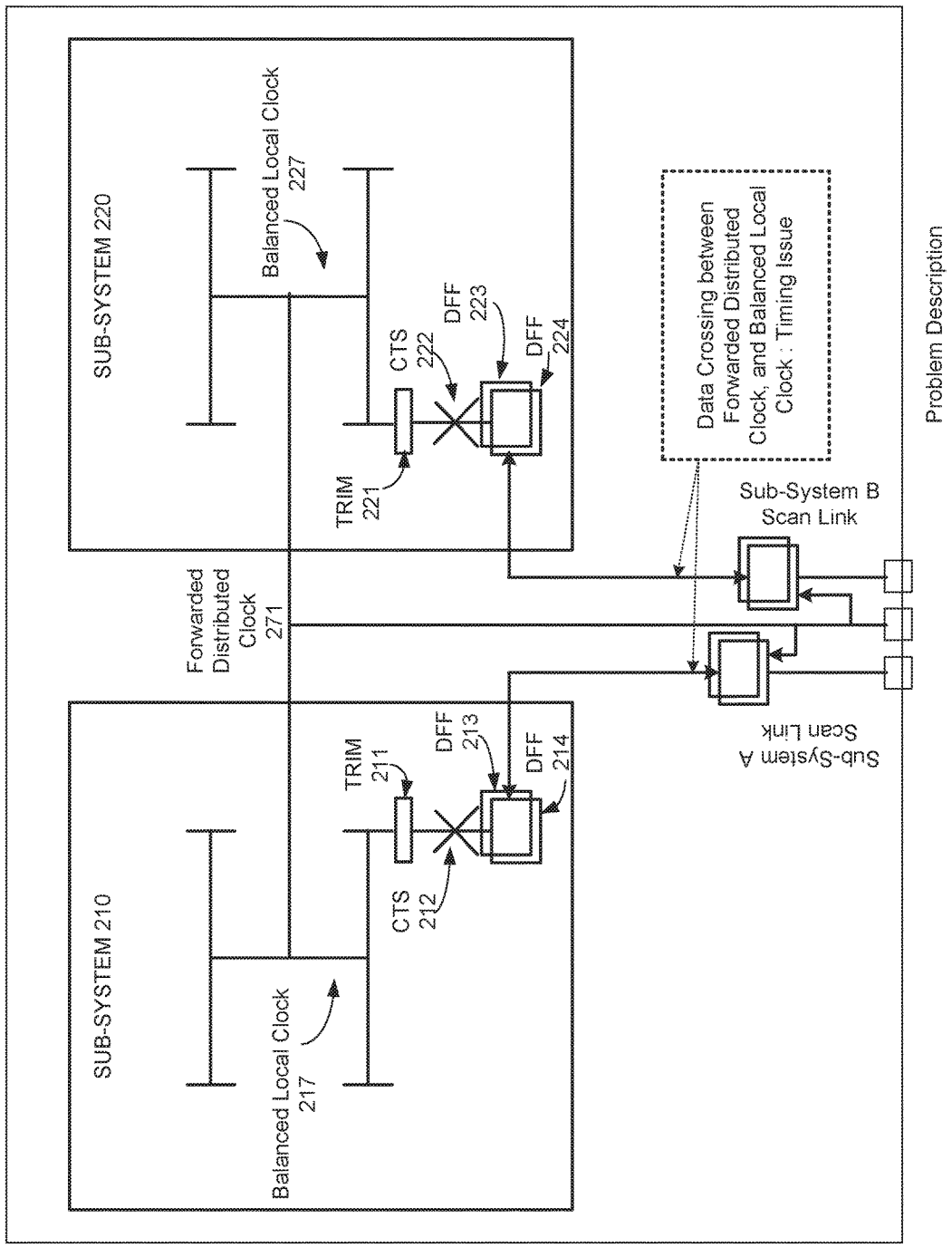
FIG. 2 is a block diagram of an exemplary system without deskew correction.

FIG. 2 is a block diagram of an exemplary system without deskew correction. As indicated in the FIG. 2, data crossing between forwarded distributed clock 271 and balanced local clock 217 and 227 have timing issues without a correction or coordination mechanism. In one conventional approach without globally balancing the clocks, it is not able to time all the data transfer between global clock and locally balanced clocks. The clock skew between a globally distributed clock and a locally balanced clock could be from 0 cycle to multiple cycles.

In one embodiment, a partition boundary data communication crossing coordination approach is based on a mesochronous technique for data transfer that helps solve the limitations of balanced clock distribution while remaining compliant with the EDA tool requirements. In one embodiment, the impact of unknown clock skew is reduced or eliminated. Unlike conventional attempts in which the impact of unknown clock skew is difficult to managed during clock distribution, the impact of unknown clock skew is reduced or eliminated by the coordination components (e.g., 131, 132, etc.). In one exemplary implementation, a coordination component is used to coordinate data communication controlled by external clock networks and internal clock networks where clock skews are otherwise unmanageable.

In one embodiment, skew tolerant coordination approach (e.g., which can be used for mesochronous crossings, etc) includes several different characteristics, including: 1) no or reduced clock balancing requirements across IPs; and 2) clock distribution and timing closure can be done completely or substantially at the IP level without dependence on SOC. These characteristics can facilitate reuse of IPs in various targeted chips with reduced clock skew concerns or issues. In one exemplary implementation, the characteristics can also include: 1) removal or reduction of clock balancing requirements across IPs improving the quality of clocks while saving engineering efforts and die size; 2) improve Multi-Voltage inter-subsystem timing requirements; 3) enabling IP level clock distribution as well as test insertion independent of chip level integration; and 4) faster turn-around while reusing the IPs.

Figure 3:
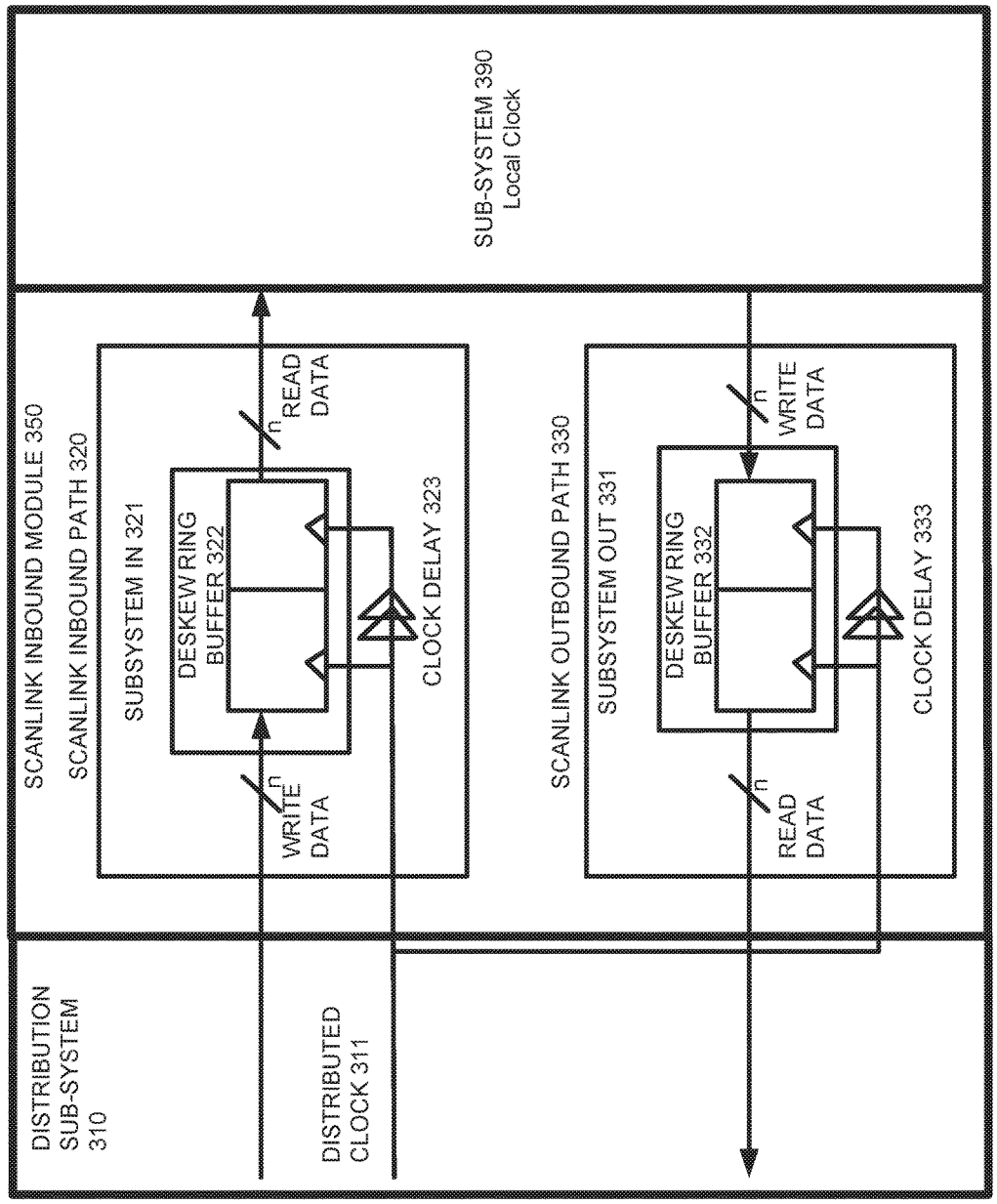
FIG. 3 shows one exemplary implementation of a deskew link between a plurality of partitions or subsystems.

FIG. 3 shows one exemplary implementation of a scan-link module 350 between a distribution subsystem 310 and a sub-system 390. The scanlink module 350 is an integrated circuit partition boundary crossing coordination interface or component. The scanlink inbound path can be from 0 insertion (global clock) to deep insertion (local balanced clock), and the scanlink outbound path can be from deep insertion (local balanced clock) to 0 insertion (global clock). The inbound path 320 and outbound path 330 include subsystems in 321 and subsystem out 331 respectively. Subsystems in 321 includes deskew ring buffer 322 and clock delay component 323. Subsystem out 331 includes deskew ring buffer 332 and clock delay component 333. Both of the deskew ring buffers 322 and 332 have a write clock and a read clock. On the inbound path the write clock is a distributed clock and the read clock is local balanced clock. On the outbound path the write clock is local balanced clock and the read clock is a distributed clock. The write and read pointers can be programmable and the spread is determined based on the clock skew between global clock and local clock. In one exemplary implementation, the pointers are free-running and depend only on clock being pulsed when out of reset.

Figure 4:
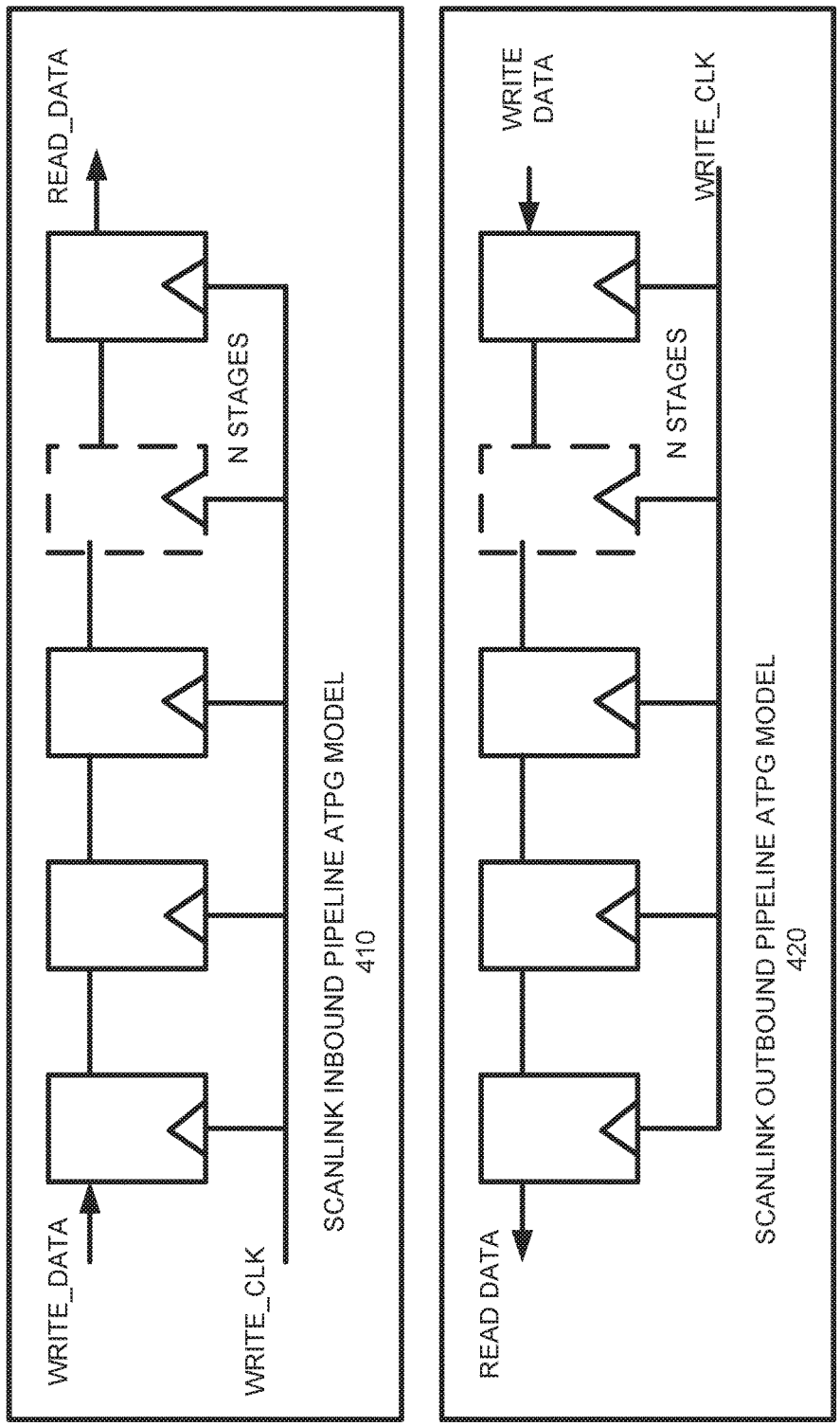
FIG. 4 shows an exemplary pipeline model for inbound and outbound paths in accordance with one embodiment.

In one exemplary implementation, the scheme is fully synchronous and deterministic and it can be modeled for ATPG tools using simple pipeline flops. ATPG EDA tools do not typically understand or simulate the partition boundary crossing coordination components, so in order to generate ATPG pattern a simplistic pipeline model is utilized to interact with ATPG tools. In one exemplary implementation, the depth of the model pipeline is dependent on the pointer difference for the read/write interface. FIG. 4 shows an exemplary pipeline model for inbound and outbound paths in accordance with one embodiment. The models includes scanlink inbound pipeline ATPG model 410 and scanlink outbound pipeline ATPG model 420. Each ATPG model 410 and 420 has "N" respective pipeline stages.

Figure 5:
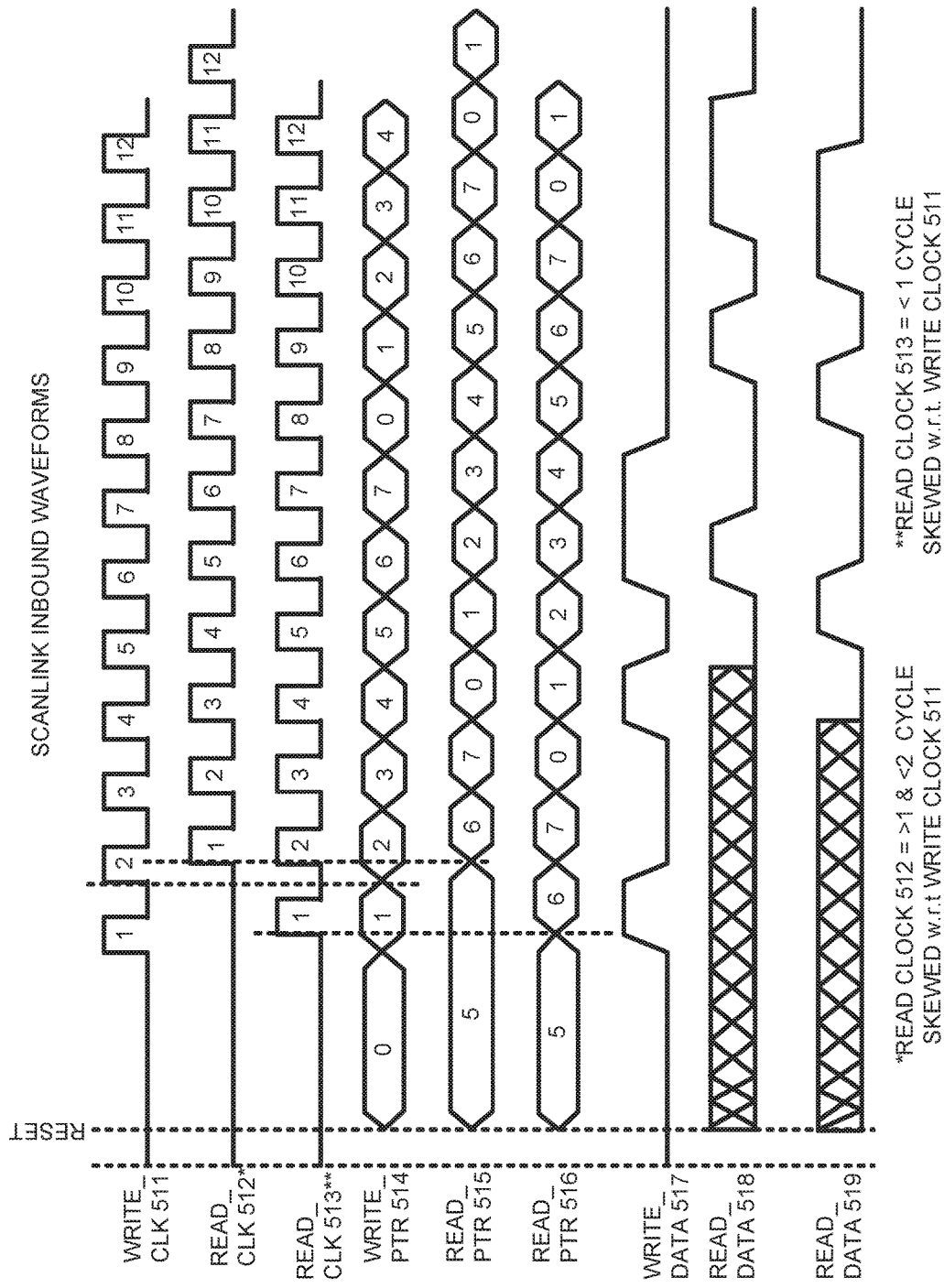
FIG. 5 shows exemplary waveforms for an inbound path in accordance with one embodiment.

FIG. 5 shows exemplary waveforms for inbound path in accordance with one embodiment. Write clock 511 is a global clock and read clock 512 is a local balanced clock in a first partition and Read-clock 513 is a local balanced clock in a second partition. The clock skew between global clock and local clock could be <=one clock cycle, or could be more than 1 cycle. This diagram illustrates the two cases where the clock skew is <=1 cycle (e.g., between write clock 511 and read clock 513), and between 1 and 2 cycles (e.g., between write clock 511 and read clock 512). In one exemplary implementation, the write Pointer 514 is set to 0 and read pointers 515 and 516 are set to 5 on reset, and after that write and read pointers are free-running depending on write and read clock pulsing. In this case the pointer spread is 5 that means the read data (e.g., 518, 519, etc.) will arrive 4 cycles later (e.g., after the write data, and that can be modeled as 4 stages of in a pipeline.

Figure 6:
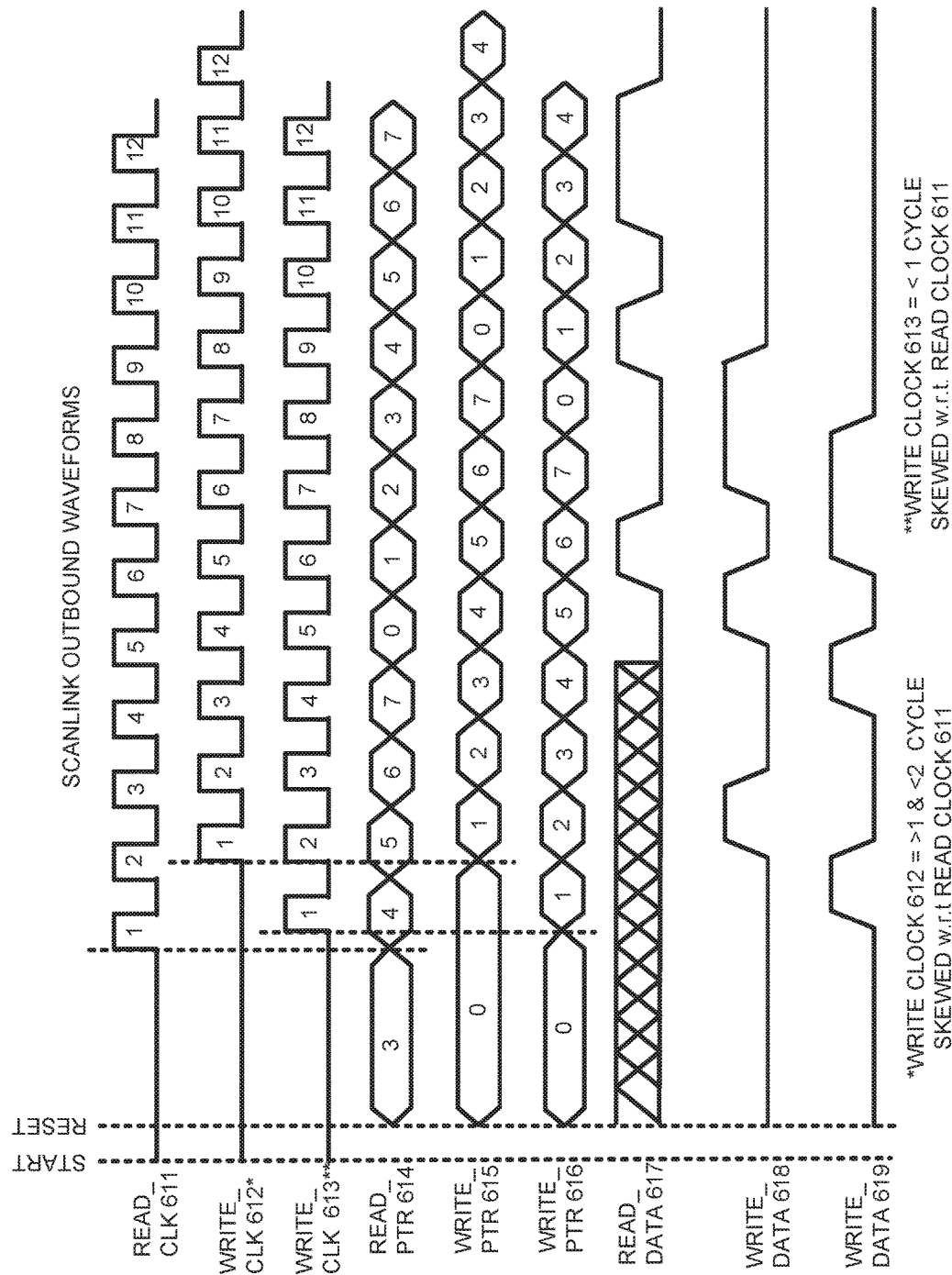
FIG. 6 shows exemplary waveforms for an outbound path in accordance with one embodiment.

FIG. 6 shows exemplary waveforms for outbound path in accordance with one embodiment. Write clocks 612 and 613 are local balanced clocks within a partition, and read clock 611 is a global clock. The clock skew between global clock and local clock could be <=one clock cycle, or could be more than 1 cycle. This diagram illustrates the two cases where the clock skew is <=1 cycle, and between 1 and 2 cycles. In this case the write Pointer 615 is set to 0 and read pointer 614 is set to 3 (in this example) on reset, and after that write and read pointers are free-running depend on write and read clock pulsing. In this case the pointer spread is 3 that means the read data (e.g., 618) will arrive 6 cycles later, and that can be modeled as 6 stages of pipeline.

FIG. 7 is a flow chart of a method in accordance with one embodiment.

In block 710, a first clock is distributed to a plurality of partitions. the first clock is an incoming distributed clock In block 720, a second clock that is locally balanced with at least one of the partitions is generated. In one embodiment, the second clock is a balanced local clock In block 730, mesochronous synchronization is performed to mitigate clock skew constraint between the first clock and the second clock. In one embodiment, the ring buffer is utilized in the performance of the mesochronous synchronization. The respective input and output pointers associated with the ring buffer can be asynchronously reset. The respective input and output pointers associated with a ring buffer can be asynchronously de-asserted with clocks off. A reset as well as the reset default values can be JTAG programmable. After a reset there can be a fixed difference in a spread between the write and read pointer. In one exemplary implementation, the difference is based on the skew of the first clock and the second clock. The difference can be used for timing the data path crossings using the multi cycle scheme. The partitions can be test partitions.

Some environments or applications involve particular timing constraints and the boundary deskew interfaces facilitate compliance of data communication with the constraints. The data communication constraints can be associated with testing operations. The granular dynamic test systems and methods can be used for both production testing and on-line testing. The production testing can be directed to finding manufacturing defects and the on-line testing can be directed to finding errors that develop after product shipment. The testing systems and methods can support testing features for external testing (e.g., testing with Automatic Test Equipment (ATE)) as well as on system internal testing.

In one embodiment, granular dynamic test systems and methods enable flexible adjustment and adaptability to a variety of different conditions that arise during testing. The granular dynamic test systems and methods can enable utilization of ultra fast interfaces that are compatible with a variety of test operations (e.g., execution of different types of tests, different test modes, etc.). In one exemplary implementation, the different types of tests and test modes can be executed in substantially in parallel or concurrently across various circuits or sections of a die. The flexible adjustment and adaptability facilitate conservation of resources and improved testing performance over conventional approaches.

Figure 8:
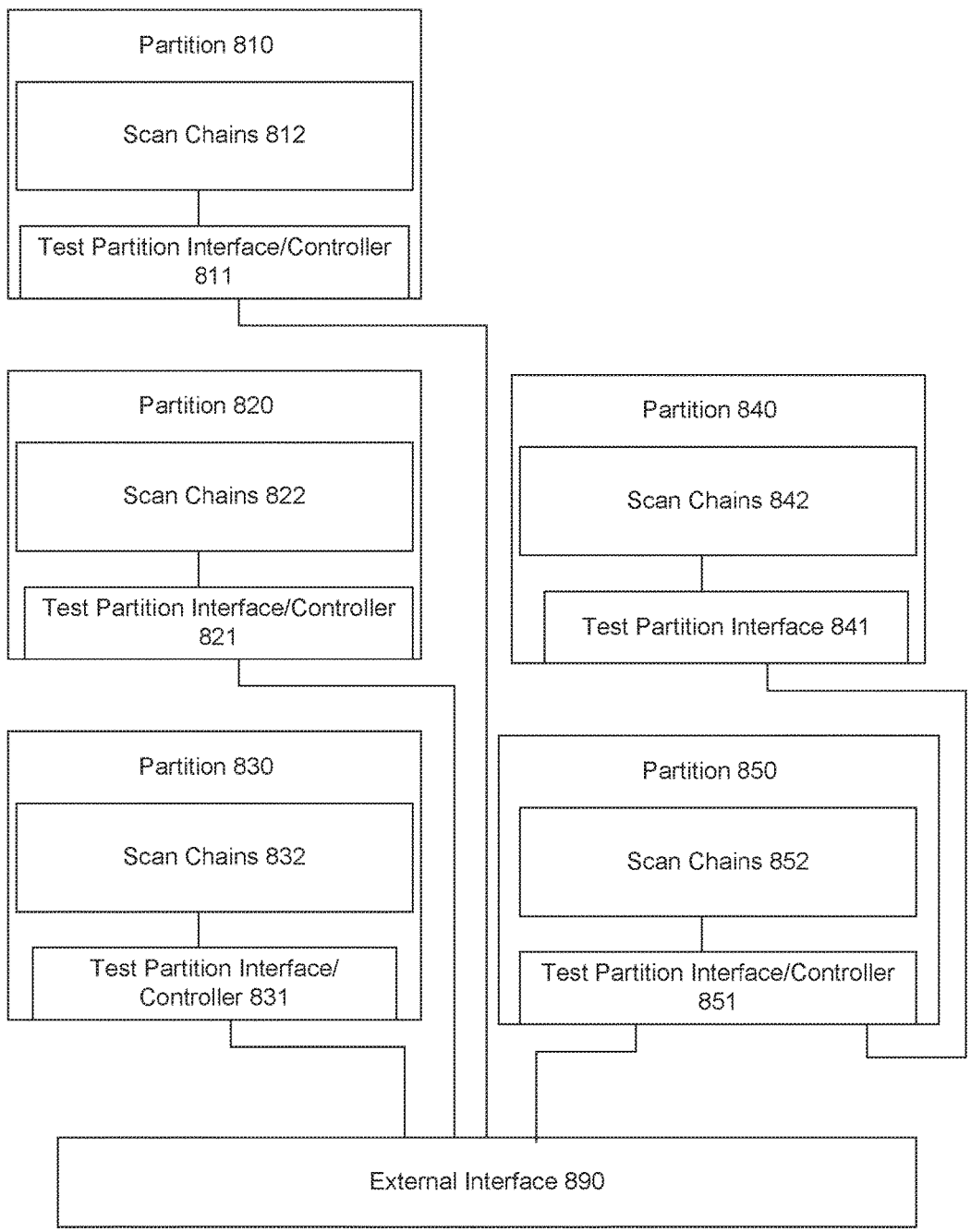
FIG. 8 is a block diagram of test system in accordance with one embodiment.

FIG. 8 is a block diagram of test system 800 in accordance with one embodiment. Test system 800 includes test partition 810, test partition 820, test partition 830, test partition 840, test partition 850 and external interface 890. Test partitions 810, 820, 830, 840, and 850 include scan chains 812, 822, 832, 842, and 852 respectively. Test partitions 810, 820, 830, and 840 include test partition interfaces/controllers 811, 821, 831, and 841. In one embodiment, test partitions 840 and 850 are very similar and are considered to be similar IP or functionally equivalent. As such, the test partition interface/controller 381 can be considered to provide control operations for test partition 850 via test partition interface 851. In one embodiment, test partition interface/controller 841 is considered a centralized controller for both test partition 840 and test partition 850. Test partition interface 851 can be less complex than test partition interface/controller 841 (e.g., interface 851 has less controls and is considered an interface rather than interface/controller). It is appreciated that test system 800 can have a variety of configurations. In one embodiment, there are some test interface and control operations that can be performed by a centralized controller even if the partitions are not similar (e.g., do not have same IP, are not functionally similar, etc.).

A granular dynamic test system and method can allow parallel testing of multiple test partitions in a given SOC. It also enables greater multi-site testing opportunities to further lower the test cost. The granular dynamic test systems and methods can include a dynamic test clock architecture that eliminates or reduces the interdependency in clocking across blocks and allows substantially concurrent yet independent testing of a block with its own pattern set. The granular dynamic test system and method architecture contributes to significant reduction of test application time by improving the scan shift frequency and efficiently utilizing the ATE resources by optimally scheduling various tests.

In one embodiment, a partition boundary crossing coordination component is configured for utilization with an Ultra Fast Interface. An Ultra-Fast Interface (UFI) test access mechanism is an expedient and flexible mechanism for testing operations, unlike traditional ways of communicating to a centralized controller. In one embodiment an UFI test access mechanism can provide high bandwidth access to test logic with reduced cycle overhead while allowing concurrent testing of multiple test partitions in a chip. A UFI can be used to coordinate communication between external scan inputs at relatively higher speed and communications or operations within a test partition at a relatively slower speed. In one embodiment, both the external communication operations and internal test partition operations are faster than JTAG TCK.

Figure 9:
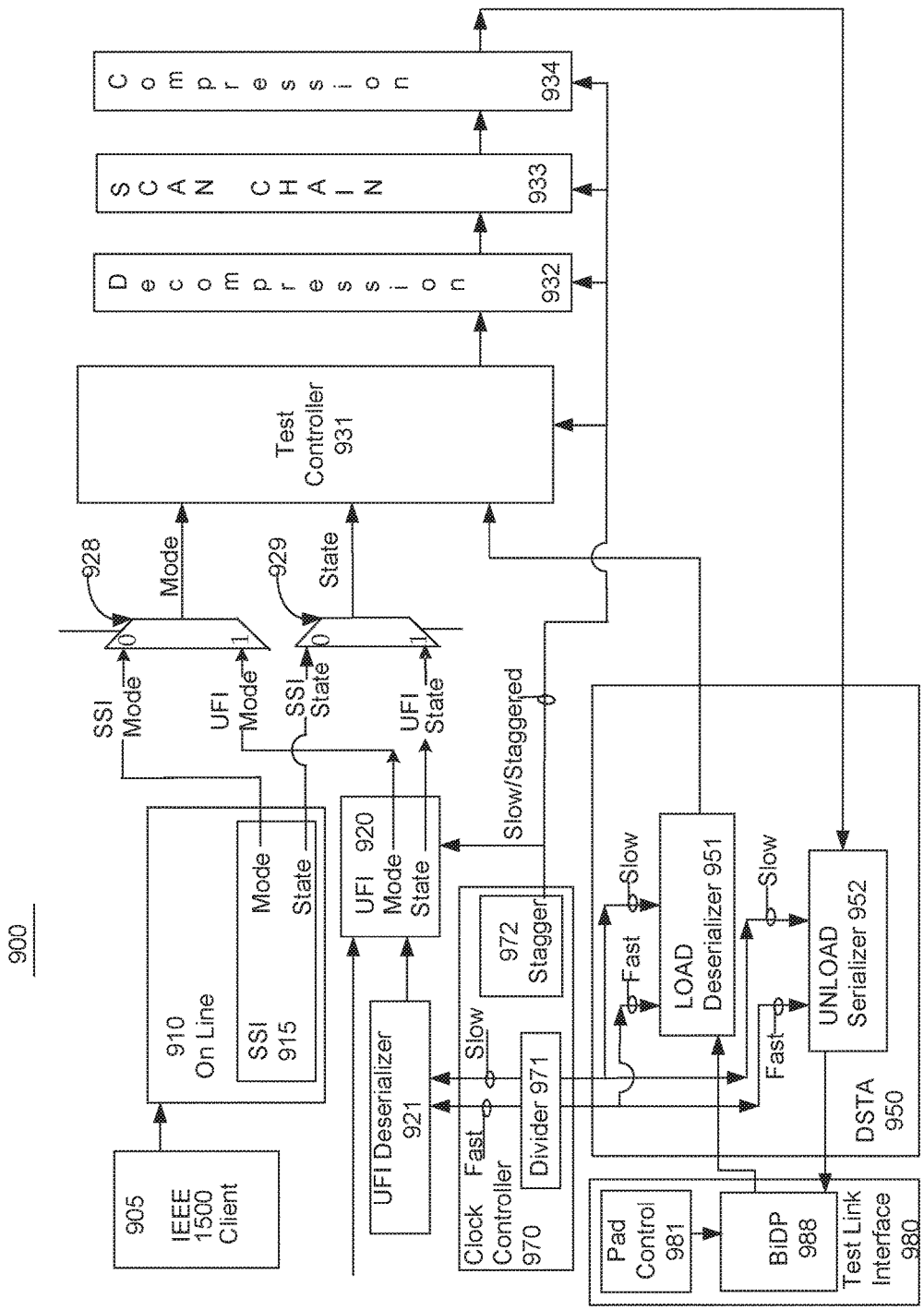
FIG. 9 is a block diagram of an exemplary system in accordance with one embodiment.

FIG. 9 is a block diagram of an exemplary system 900 in accordance with one embodiment. System 900 can operate as a test partition interface/controller. In one exemplary implementation, system 900 is similar to a test interface/controller 911 or 921. System 900 includes IEEE 1500 client interface 905, On Line module 910, Ultra Fast Interface (UFI) controller 920, UFI de-serializer 921, mode MUX 928, State MUX 929, Test Controller 931, Scan Decompression Component 932, Scan Chain Component 933, Scan Compression Component 934, Dynamic Scan Test Access (DSTA) Component 950, Clock Controller 970 and Test Link Interface 980 and Bi-Directional Pads 988. Mode MUX 928 and State MUX 929 are coupled to Test Controller 931, Ultra Fast Interface (UFI) controller 920 and On Line module 910 which is coupled to IEEE 1500 client interface 905. UFI 920 is coupled to UFI de-serializer 921. Clock controller 970 is coupled to Ultra Fast Interface (UFI) controller 920, UFI de-serializer 921, Test Controller 931, Scan Decompression Component 932, Scan Chain Component 933, Scan Compression Component 934, and DSTA 950. DSTA 950 is coupled to Bi-Directional Pads 988 which is in Test Link Interface 980. On Line module 910 can include SSI 915. Clock Controller 970 can include divider 971 and stagger 972. DSTA 950 can include load component 951 and unload component 952.

In one embodiment, UFI de-serializer 921 receives an ultra fast serial signal and de-serializes the signal into separate signals that are forwarded to the UFI module 920. UFI module 920 generates UFI mode information and UFI state information which is fed into mode MUX 928 and State MUX 929 respectively. On Line module 910 receives signals from IEEE 1500 client interface 905 and generates SSI mode information and SSI state information which is fed into mode MUX 928 and State MUX 929 respectively. Mode MUX 928 selects either the UFI mode information or SSI mode information and forwards the selected information to Test Controller 931. State MUX 929 selects either the UFI state information or SSI state information and forwards the selected information to Test Controller 931.

Test controller 931 organizes the test signals and forwards them to Scan Decompression Component 932. Scan Decompression Component 932 decompresses the signals and forwards them to Scan Chain Component 933. Scan Chain Component 933 performs the scan test operations (e.g., scan shift, scan capture, etc.) and forwards the results to Scan Compression Component 934. Scan Compression Component 934 compresses the test results and forwards the compressed test results to DSTA 950. DSTA 950 receives scan test input data from external connections of bi-directional pads 988 and forwards scan test output data to external connections of bi-directional pads 988. Test Link Interface 980 includes pad direction controller 981 that controls the communication direction of Bi-Directional Pads 988. Clock controller 970 generates clocks signals.

In one embodiment, the clock signals are coordinated in accordance with the rates of input and output signals of the various components. In one exemplary implementation, the Clock controller 970 receives a single free flowing clock input and generates a fast internal clock, a slow internal clock and a slow staggered internal clock. The fast internal clock and slow internal clock are forwarded to the UFI deserializer 921, LOAD deserializer 951, and UNLOAD serializer 952 for use in respective deserializing/serializing operations. The slow staggered internal clock is forwarded to Test Controller 931, Scan Decompression Component 932, Scan Chain Component 933 and Scan Compression Component 934 for clocking the test operations of the respective components.

In one embodiment, a centralized controller directs testing operations for one or more scan chains. A centralized test controller can handle the communication to the CODEC modules to generate stimulus data, and compare response data. The centralized controller module in turn is controlled using a set of instructions sequenced using an interface (e.g., UFI interface, JTAG TAP interface, etc.). This scheme of centralized controlling can be utilized with a variety of test techniques such as logic scan test, memory test etc.

Figure 10:
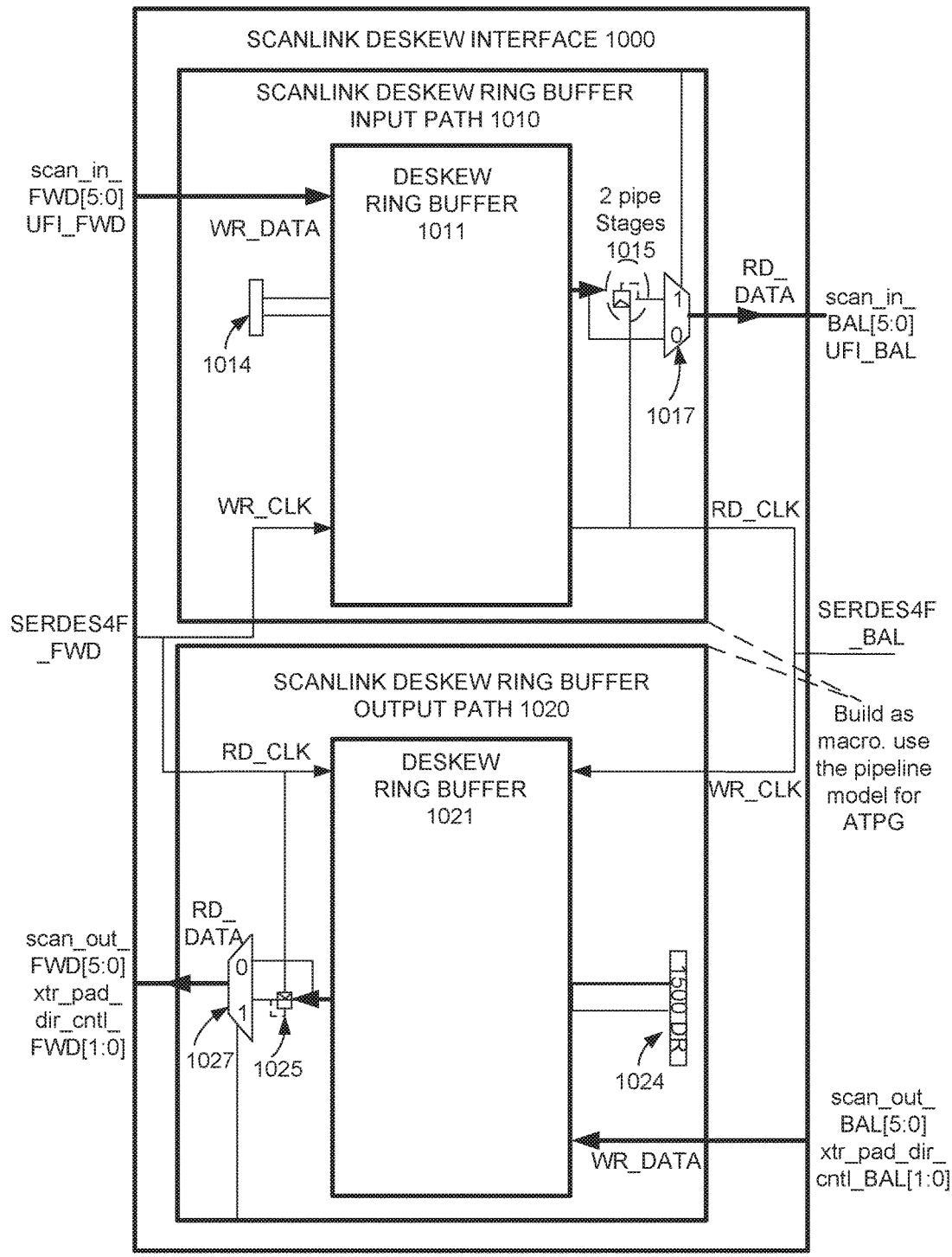
FIG. 10 is a block diagram of an exemplary UFI deskew implementation in accordance with one embodiment.

FIG. 10 is a block diagram of an exemplary skew tolerant data interface 1000 in accordance with one embodiment. In one exemplary implementation, the skew tolerant data interface is a scanlink deskew interface. The scanlink deskew interface can be utilized with a UFI interface. Skew tolerant data interface 1000 includes scan link deskew ring buffer input path 1010 and an link deskew ring buffer input path 1020. Scan link deskew ring buffer input path 1010 includes deskew ring buffer 1011, register 1014, pipeline stage 1015 and MUX 1017. Scan link deskew ring buffer input path 1020 includes deskew ring buffer 1021, register 1024, pipeline stage 1025 and MUX 1027.

Figure 11:
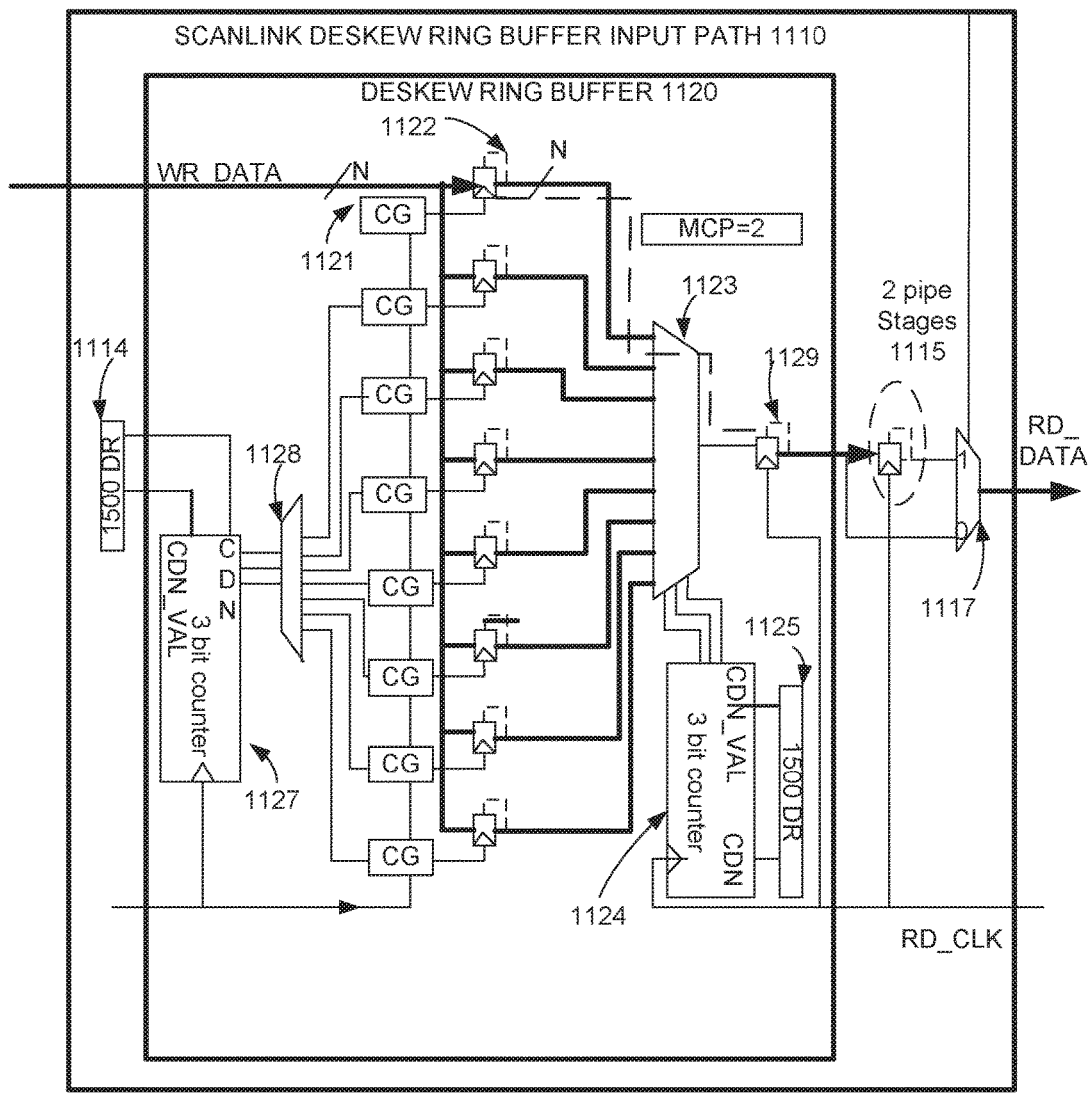
FIG. 11 is a block diagram of an exemplary scanlink deskew ring buffer input path in accordance with one embodiment.

FIG. 11 is a scanlink deskew ring buffer input path 1110 in accordance with one embodiment. Scan link deskew ring buffer input path 1110 includes deskew ring buffer 1120, register 1114, pipeline stage 1115 and MUX 1117. Deskew ring buffer 1120 includes clock gate 1121, pipeline stages 1122 and 1129, MUXs 1123 and 1128, counters 1124 and 1127, and register 1125. Counter 1127 is coupled to MUX 1128 which is coupled to clock gate 1121 which in turn is coupled to pipe stages 1122. Pipe stages 1122 are coupled to MUX 1123 which is coupled to pipeline stages 1129 and counter 1124, which is coupled to register 1125. It is appreciated there can be multiple clock gates similar to clock gate 1121 coupled to respective multiple sets of pipeline stages similar to clock gate 1122.

Figure 12:
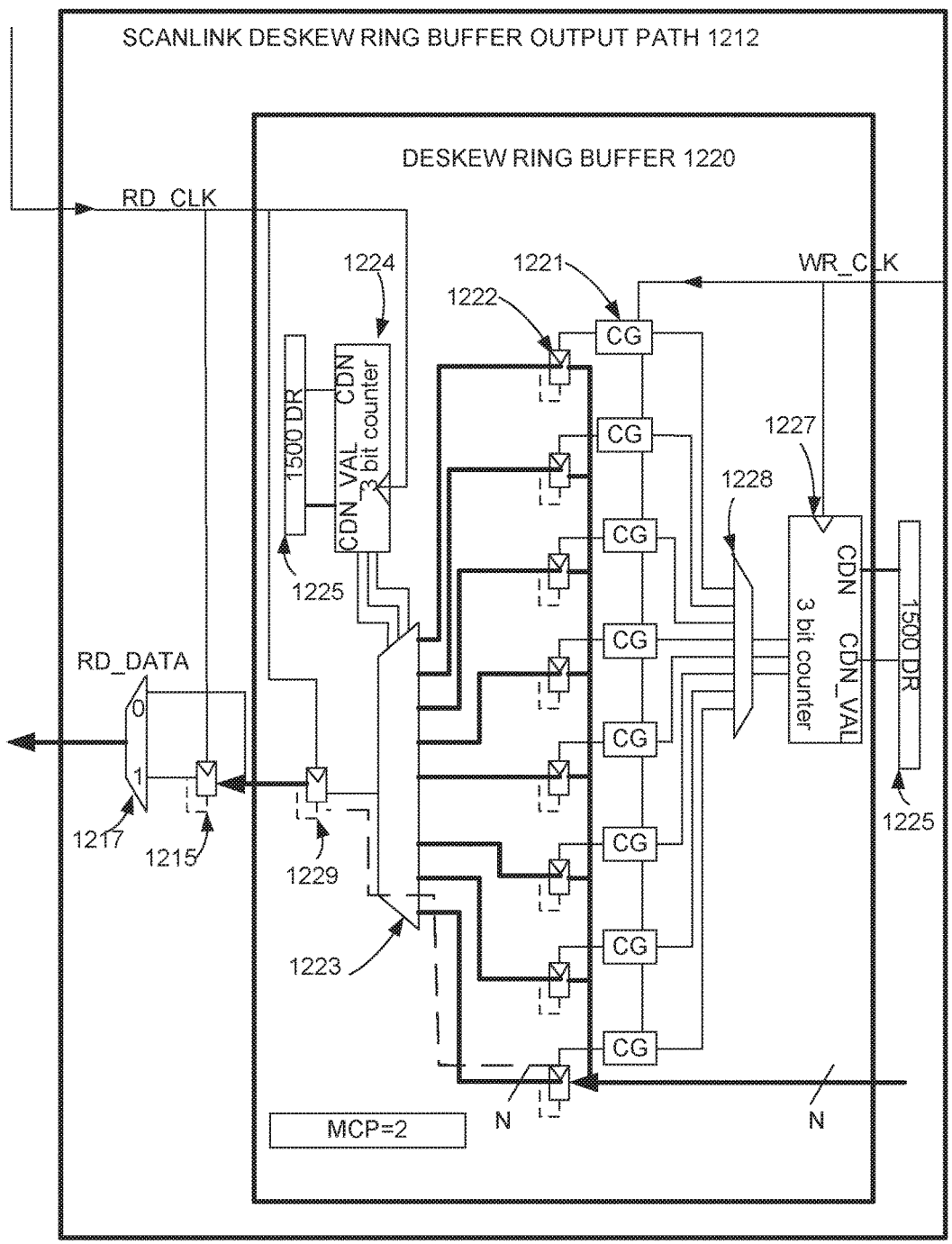
FIG. 12 is a block diagram of an exemplary scanlink deskew ring buffer output path in accordance with one embodiment.

FIG. 12 is a scanlink deskew ring buffer output path 1212 in accordance with one embodiment. Scan link deskew ring buffer input path 1212 includes deskew ring buffer 1220, register 1214, pipeline stage 1215 and MUX 1217. Deskew ring buffer 1220 includes clock gate 1221, pipeline stages 1222 and 1229, MUXs 1223 and 1228, counters 1224 and 1227, and register 1225. Counter 1227 is coupled to MUX 1228 which is coupled to clock gate 1221 which in turn is coupled to pipe stages 1222. Pipe stages 1222 are coupled to MUX 1223 which is coupled to pipeline stages 1229 and counter 1224, which is coupled to register 1225. It is appreciated there can be multiple clock gates similar to clock gate 1221 coupled to respective multiple sets of pipeline stages similar to clock gate 1222.

Figure 13:
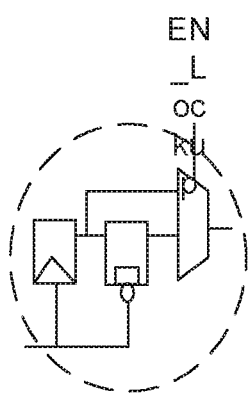
FIG. 13 is a block diagram of an exemplary pipe stage scanlink deskew ring in accordance with one embodiment.

FIG. 13 is a block diagram of an exemplary pipe stage of scanlink deskew ring buffer in accordance with one embodiment. In one exemplary implementation, the pipe stage is similar to pipe stage 1015.

Figure 14:
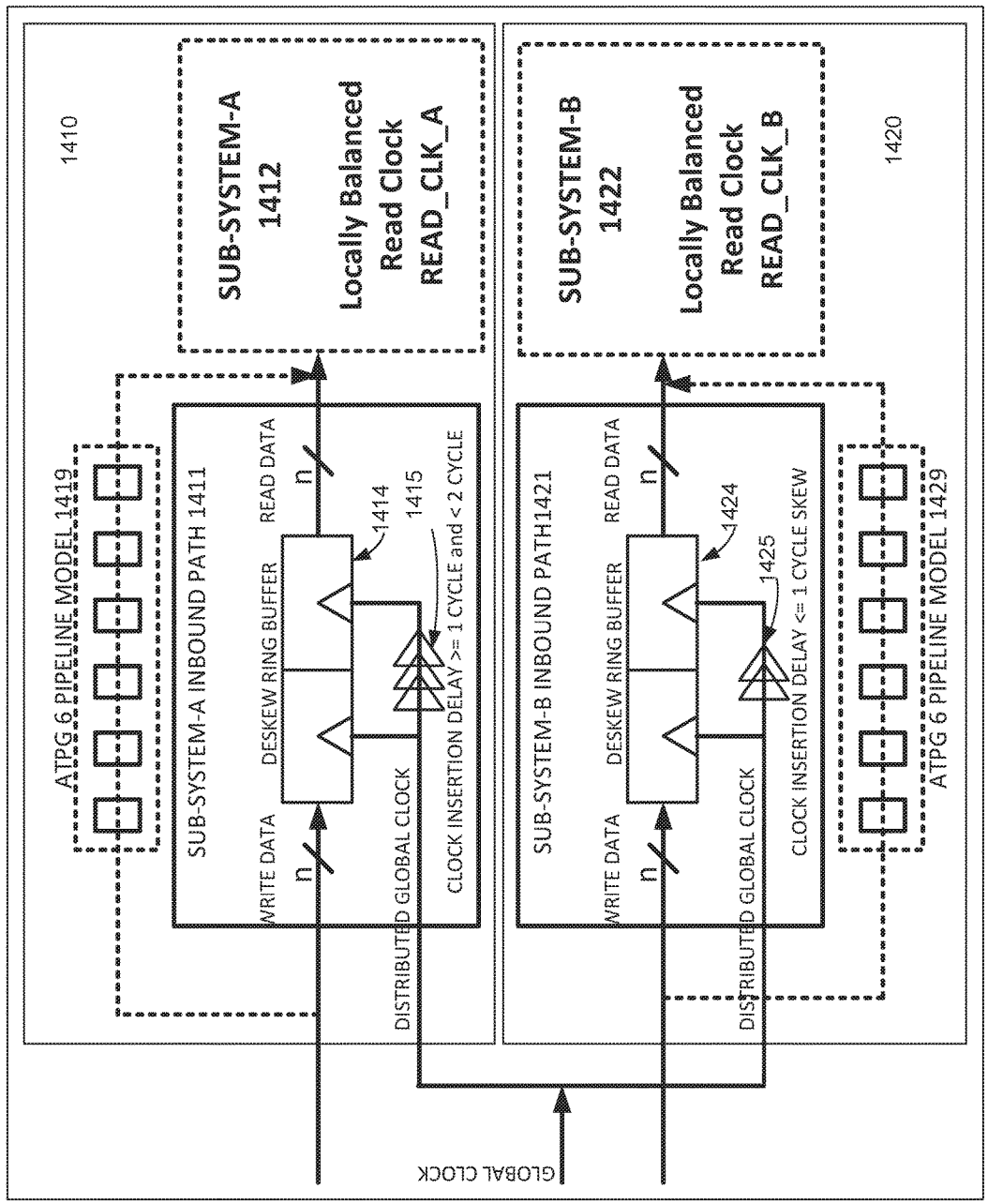
FIG. 14 show the relationship between exemplary ATGP pipeline models and respective inbound paths in accordance with one embodiment.

FIG. 14 show the relationship between an exemplary ATPG pipeline models and the INBOUND paths in accordance with one embodiment. Sub-system A clock domain control 1410 includes sub-system A locally balanced read clock components 1412 and sub-system-A inbound path components 1411 which can be modeled by pipeline model 1419. Sub-system-A inbound path components 1411 include deskew ring buffer components 1414 and delay components 1415. Sub-system A clock domain control 1420 includes sub-system A locally balanced read clock components 1422 and sub-system-A inbound path components 1421 which can be modeled by pipeline model 1429. Sub-system-A inbound path components 1421 include deskew ring buffer components 1424 and delay components 1425. In one embodiment, the respective locally balanced read clocks (e.g., READ clock_A and READ clock_B, etc.) are different. The respective deskew ring buffers and the subsystem clock insertion delays compensate for the differences in the distributed clock and the respective locally balanced read clocks. In one exemplary implementation, the pipeline stages can correspond to the spread between the respective pointers or the ring buffers. In one exemplary implementation, FIG. 14 shows the inbound paths (write from IO to sub-system A & B) going to Sub-System-A and Sub-system-B. The inbound paths to Sub-system A and B have different clock insertion delay from global to local clock.

The Clock Skew from 0 insertion delay of global clock to deep insertion delay at local clock is different for sub-system A and sub-system B. The Clock insertion delay for sub-system A inbound path is >=1 clock cycle and <2 clock cycle. The Clock insertion delay for sub-system B inbound path is <=1 clock cycle.

Figure 15:
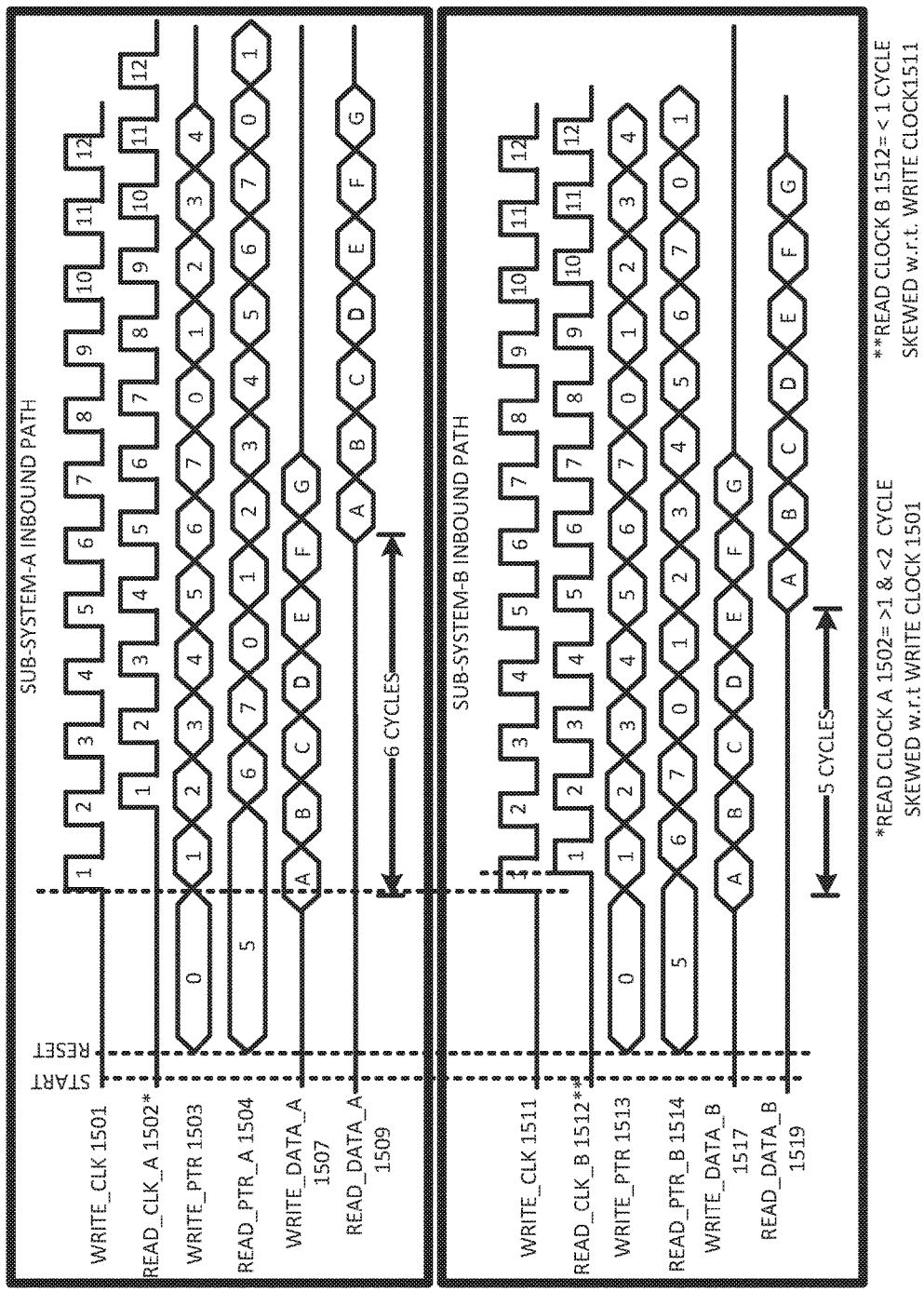
FIG. 15 is a bock diagram of exemplary waveforms for inbound paths of subsystems or partitions with different clock insertion delay in accordance with one embodiment.

FIG. 15 is a bock diagram of exemplary waveforms for inbound paths of subsystems or partitions with different clock insertion delay. In one exemplary implementation the waveforms correspond to inbound paths Sub-system-A and Sub-system-B show in FIG. 14. Subsystem A input or inbound path waveforms include write clock 1501, read clock 1502, write pointer 1503, read pointer 1504, write data 1507, and read data 1509. Subsystem B input or inbound path waveforms include write clock 1511, read clock 1512, write pointer 1513, read pointer 1514, write data 1517, and read data 1519. Write and Read pointers are set to 0 and 5 respectively and so the read data is available at different cycle for sub-system-A (6 cycles) and sub-system B (5 cycles). The 0 insertion to deep insertion clock skew between write clock and read clock for sub-system A is >=1 clock cycle and <2 clock cycle. And the zero insertion to deep insertion clock skew between write clock and read clock for sub-system B is <=1 clock cycle. When the initial write pointer and read pointers are set to 0 and 5 respectively, we see that the read data available at sub-system A after 6 clock cycles, and at sub-system B after 5 clock cycles. For ATPG pattern generation, our assumption is that both sub-system A and B should have similar delay for write assuming both sub-system should receive the pattern data in same cycles. In this case, we will need to set the write and read pointer to different value to make sure the data should be available after exactly 6 cycles later for both sub-systems.

Figure 16:
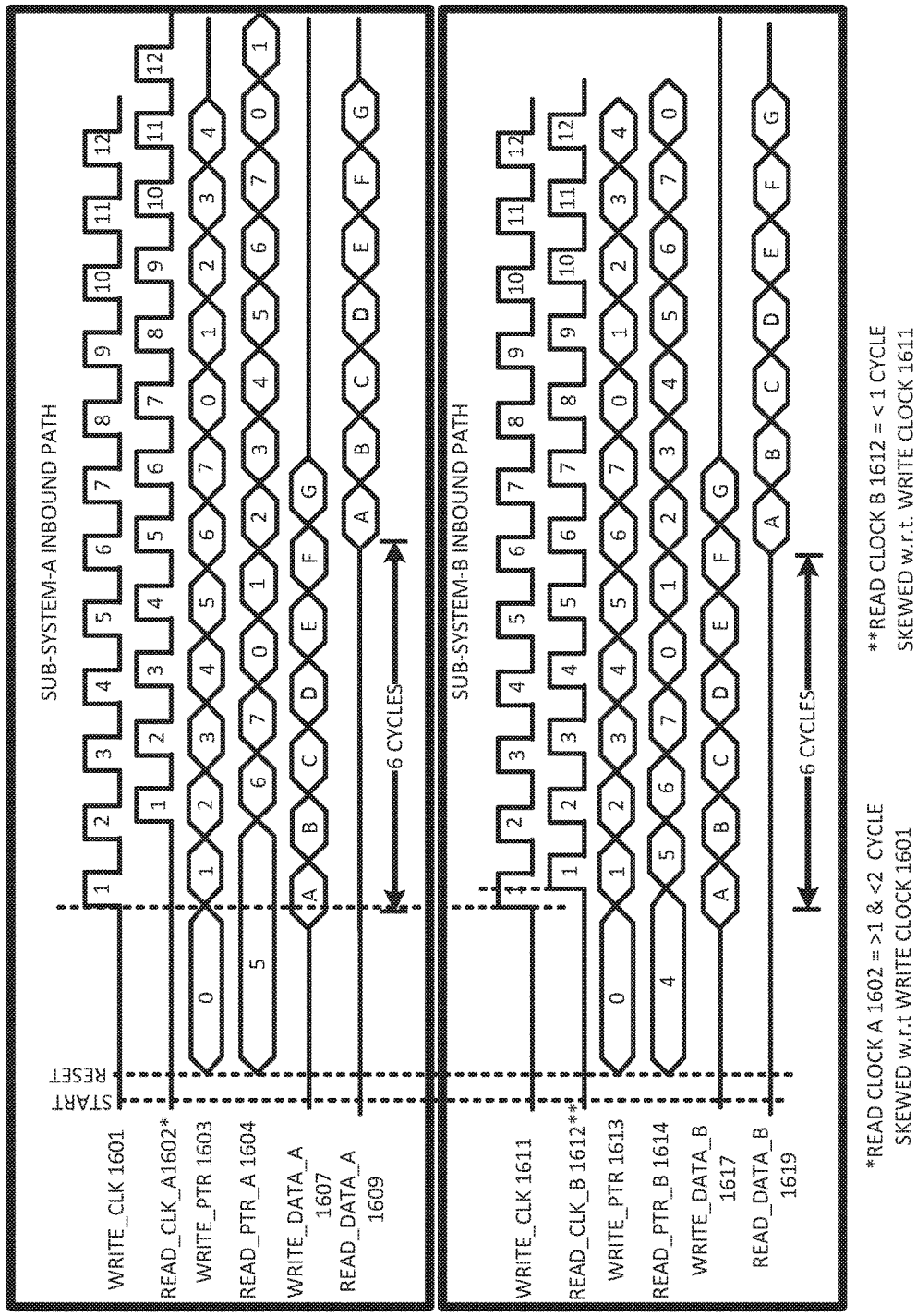
FIG. 16 is a bock diagram of other exemplary waveforms for inbound paths of subsystems or partitions with different clock insertion delay in accordance with one embodiment.

FIG. 16 is a bock diagram of other exemplary waveforms for inbound paths of subsystems or partitions with different clock insertion delay. In one exemplary implementation the waveforms correspond to inbound paths Sub-system-A and Sub-system-B shown in FIG. 14. Sub-system-A and Sub-system-B shown in FIG. 14. Subsystem A input or inbound path waveforms include write clock 1601, read clock 1602, write pointer 1603, read pointer 1604, write data 1607, and read data 1609. Subsystem B input or inbound path waveforms include write clock 1611, read clock 1612, write pointer 1613, read pointer 1614, write data 1617, and read data 1619. Write and Read pointers are programmed differently causing the different read delay for sub-system-A and sub-system B. Write and Read pointers are programmed such that the read data available at the same cycle for sub-system-A and sub-system B. The read pointer for sub-system A is programmed to 5 and read pointer for sub-system B is programmed to 4. Write pointer are still set to 0 upon reset. This will make sure the read data is available after 6 cycles in both sub-system A and Subsystem B, which is what ATPG tool is expecting. The ATPG Model with 6 pipelines is shown n FIG. 12 which is only used during pattern generation process. ATPG Models are only used during Test pattern generation. ATPG tools does not have any notion on clock tree insertion delay and clock skew. It assumes the clock network is ideal with zero insertion delay. Also it does not understand the complicated ring buffer logic, so for pattern generation purpose, the simplified software model is provided to ATPG tool during test pattern generation. But during actual application of these patterns on ATE to silicon, the actual ring buffer paths implemented in sub-system is used to send the scan data to/from the internal sub-system.

ATE does not use these models directly. These Pipeline Models are only for ATPG pattern generation tool. And the pipeline models provided to ATPG tool are representation of write and read pointer (for inbound and outbound path) spread required to make sure the data transfer happens successfully from zero insertion to deep, and from deep to zero insertion delay.

Figure 17:
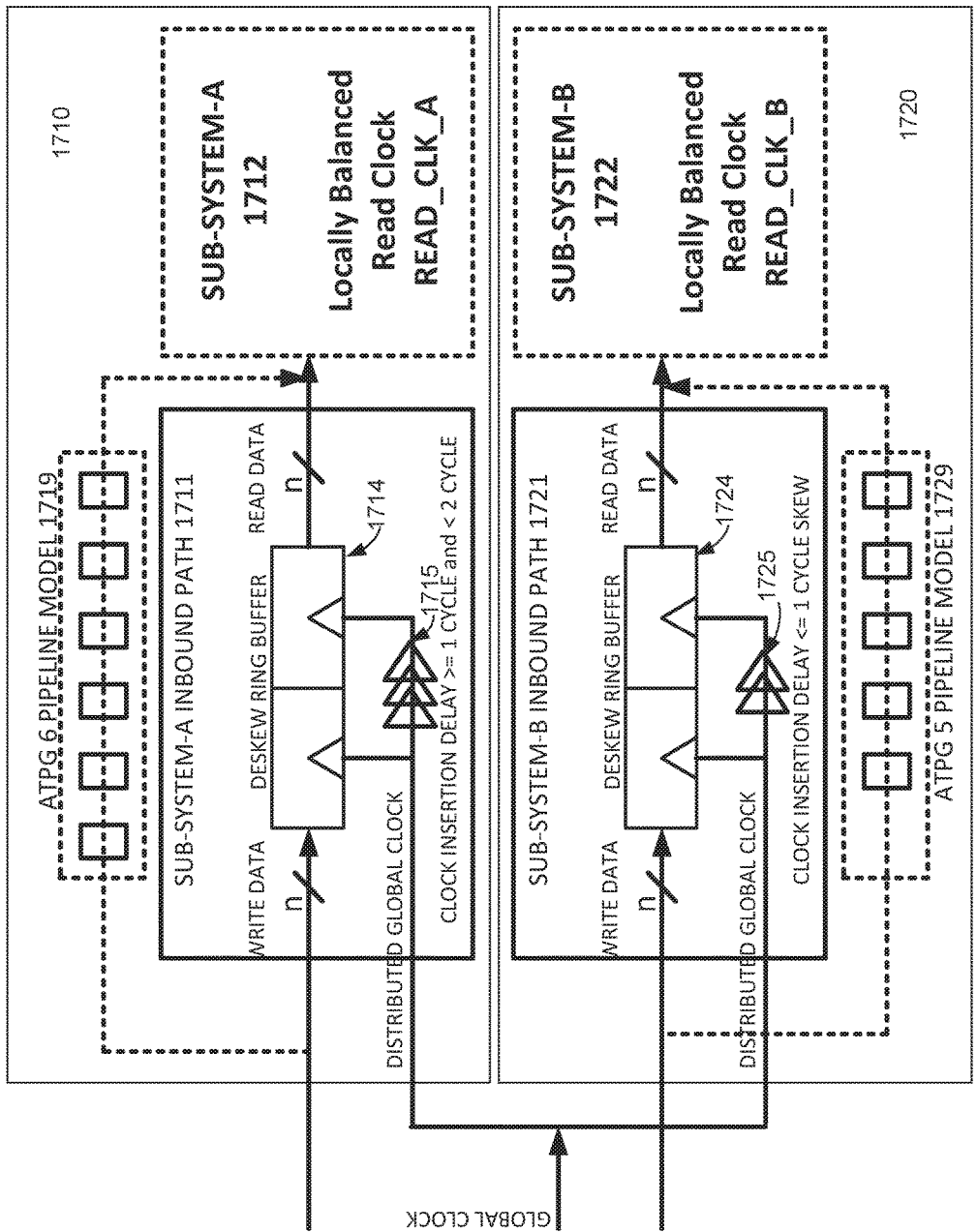
FIG. 17 shows the relationship between an exemplary ATGP pipeline models and respective inbound paths in accordance with one embodiment.

FIG. 17 shows the relationship between an exemplary ATPG pipeline models and the INBOUND paths in accordance with one embodiment.

Sub-system A clock domain control 1710 includes sub-system A locally balanced read clock components 1712 and sub-system-A inbound path components 1711 which can be modeled by pipeline model 1719. Sub-system-A inbound path components 1711 include deskew ring buffer components 1714 and delay components 1715. Sub-system A clock domain control 1720 includes sub-system A locally balanced read clock components 1722 and sub-system-B inbound path components 1721 which can be modeled by pipeline model 1729. Sub-system-B inbound path components 1721 include deskew ring buffer components 1724 and delay components 1725. In one embodiment, the respective locally balanced read clocks (e.g., READ clock_A and READ clock_B, etc.) are different. The respective deskew ring buffers and the subsystem clock insertion delays compensate for the differences in the distributed clock and the respective locally balanced read clocks. In one exemplary implementation, the pipeline stages can correspond to the spread between the respective pointers or the ring buffers. In one exemplary implementation, FIG. 17 shows the inbound paths (write from IO to sub-system A & B) going to Sub-System-A and Sub-system-B. The inbound paths to Sub-system A and B have different clock insertion delay from global to local clock.

In one exemplary implementation, FIG. 17 shows the scenario where there Sub-System A and Sub-System B test patterns are applied concurrently but independently. In these use cases, it is not required to have both data arrival from IO to subsystem at the same cycle. For example, for Sub-system A the test patterns are generated with pipeline model as 6 stages, and for sub-system B the test patterns are generated with pipeline model as 5 stages. In such cases, the read pointers for sub-system A and sub-system B should be programmed accordingly as shown in FIG. 18.

Figure 18:
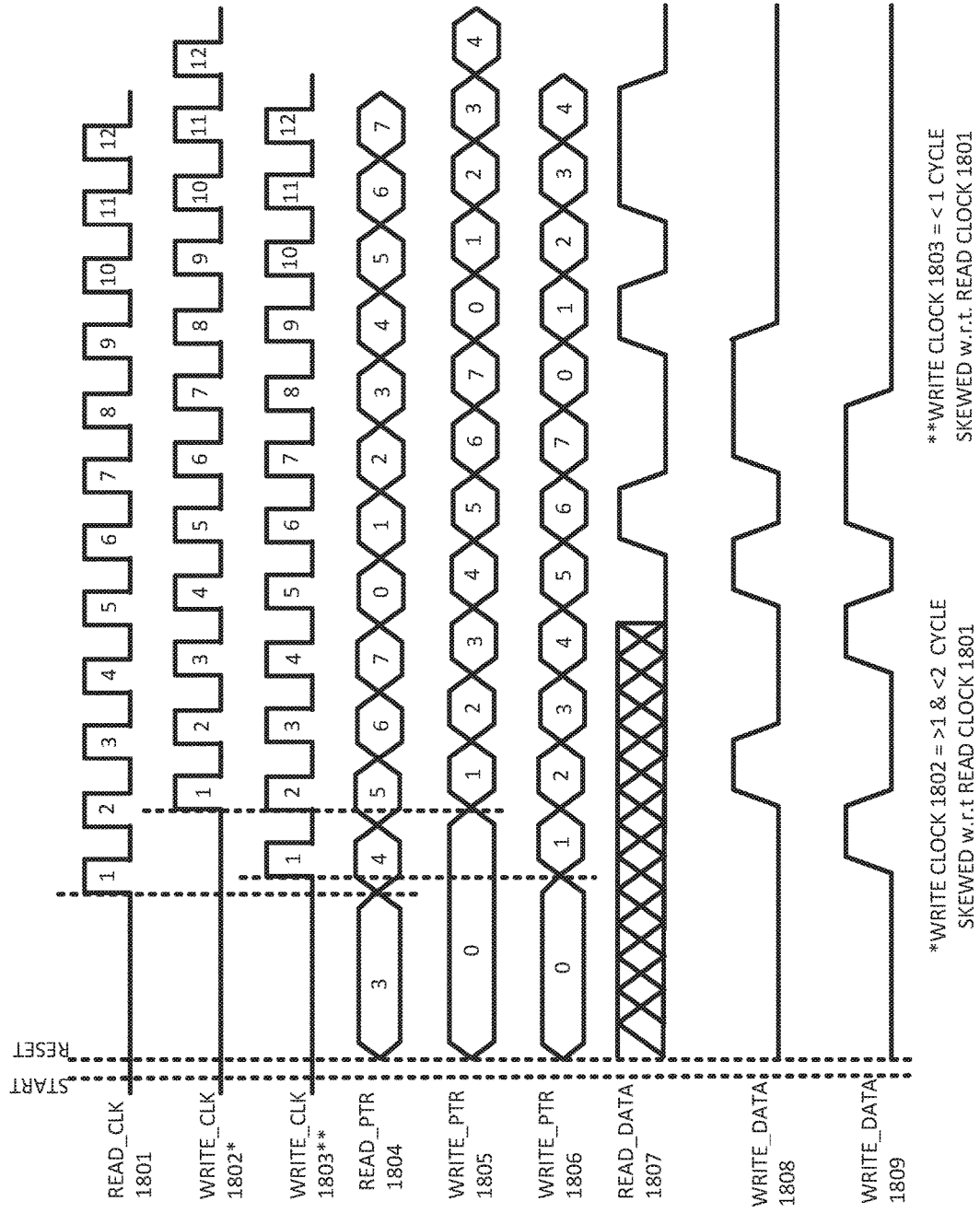
FIG. 18 is a bock diagram of other exemplary waveforms for inbound paths of subsystems or partitions with different clock insertion delay.

FIG. 18 is a bock diagram of other exemplary waveforms for inbound paths of subsystems or partitions with different clock insertion delay. In one exemplary implementation the waveforms correspond to inbound paths Sub-system-A and Sub-system-B show in FIG. 17. Write and Read pointers are programmed differently causing the different read delay for sub-system-A and sub-system B. Write and Read pointers are programmed such that the read data available at the same cycle for sub-system-A and sub-system B. The waveforms illustrate one exemplary implementation in which the read data arrival in 6 cycles for sub-system A and 5 cycles for sub-system B.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical or quantum computing device) that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as suited to the particular use contemplated. It is intended that the scope of the invention be defined by the Claims appended hereto and their equivalents. The listing of steps within method claims do not imply any particular order to performing the steps, unless explicitly stated in the claim.

What is claimed:

1. A system comprising:
   a global clock input for receiving a global clock associated with circuit testing operations;
   a plurality of partitions;
   a skew tolerant interface configured to compensate for clock skew differences between a global clock from outside at least one of the plurality of partitions and a balanced local clock within at least one of the plurality of partitions, wherein the skew tolerant interface includes a first de-skew sub system for a circuit test input path of the at least one of the plurality of partitions and a second de-skew sub-system for a circuit test output path of the at least one of the plurality of partitions.

2. The system of claim 1 wherein the plurality of partitions are test partitions.

3. The system of claim 1 wherein the skew tolerant interface crosses a mesochronous boundary and the first de-skew sub system and the second sub system are independent of the at least one of the plurality of partitions and also are independent of skew tolerant interfaces of others of the plurality of partitions.

4. The system of claim 1 wherein the skew tolerant interface includes a first deskew ring buffer in the first de-skew sub system and a second deskew ring buffer in the second de-skew sub system.

5. The system of claim 4 wherein pointers associated with the first deskew ring buffer and the second deskew ring buffer are free-running and depend only on the global clock from outside and the balanced local clock within at least one of the plurality of partitions being pulsed when out of reset.

6. The system of claim 1 wherein a compensation scheme of the skew tolerant interface is fully synchronous and deterministic.

7. The system of claim 1 wherein a compensation scheme of the skew tolerant interface is modeled for Automatic Test Pattern Generation (ATPG) tools using simple pipeline flops.

8. The system of claim 1 wherein the first de-skew sub system and the second de-skew sub system include respective pipelines, a depth of the respective pipelines is dependent on a respective pointer difference for respective read/write portions of the first de-skew sub system and the second de-skew sub system.

9. The system of claim 1 wherein input from the global clock is part of a scan link.

10. A method comprising:
    distributing a first clock to a plurality of partitions;
    generating a second clock that is locally balanced with at least one of the plurality of partitions; and
    performing mesochronous synchronization to independently mitigate clock skew constraint between the first clock and the second clock when performing test input and test output operations to and from the at least one of the plurality of partitions.

11. The method of claim 10 wherein the first clock is an incoming distributed clock and the second clock is a balanced local clock.

12. The method of claim 10 wherein a ring buffer is utilized in the performance of the mesochronous synchronization.

13. The method of claim 12 wherein respective input and output pointers associated with the ring buffers are asynchronously reset.

14. The method of claim 13 wherein the respective input and output pointers associated with the ring buffer are asynchronously de-asserted with the first clock and the second clock off.

15. The method of claim 10 wherein a reset as well as a rest default values are programmable via a test access port.

16. The method of claim 10 wherein after a reset there is a fixed difference in a spread between a write and a read pointer associated with the ring buffer.

17. The method of claim 16 wherein a difference is based on a skew of the first clock and the second clock.

18. The method of claim 17 wherein the difference is used for timing a data path crossings using a multi cycle scheme.

19. The system of claim 10 wherein the plurality of partitions are test partitions.

20. A system comprising:
    a global clock input for receiving a global clock associated with circuit testing operations;
    a plurality of partitions;
    a skew tolerant interface configured to compensate for clock skew differences between a global clock from outside at least one of the plurality of partitions and a balanced local clock within at least one of the plurality of partitions, wherein the skew tolerant interface includes a first de-skew sub system for a scan test input path of the at least one of the plurality of partitions and a second de-skew sub-system for a scan test output path of the at least one of the plurality of partitions.

* * * * *